United States Patent [19]

Jones, Jr.

[11] Patent Number: 5,373,470

[45] Date of Patent: Dec. 13, 1994

[54] METHOD AND CIRCUIT FOR CONFIGURING I/O DEVICES

[75] Inventor: Oscar F. Jones, Jr., Colorado Springs, Colo.

[73] Assignees: United Memories, Inc., Colorado Springs, Colo.; Nippon Steel Semiconductor Corporation, Chiba, Japan

[21] Appl. No.: 37,818

[22] Filed: Mar. 26, 1993

[51] Int. Cl.$^5$ .............................................. G11C 7/00
[52] U.S. Cl. .................... 365/189.05; 365/189.08; 365/189.02; 365/230.08; 327/203; 327/199
[58] Field of Search ............... 307/465, 272.1, 272.2; 365/189.8, 230.08, 154, 189.05, 189.5, 189.2, 189.8, 230.8

[56] References Cited

U.S. PATENT DOCUMENTS

| | | | |
|---|---|---|---|
| 4,680,491 | 7/1987 | Yokouchi | 365/189.5 X |
| 4,995,003 | 2/1991 | Watanabe | 365/189.5 |
| 5,068,881 | 11/1991 | Dervisoglu | 365/230.8 X |
| 5,146,427 | 9/1992 | Sasaki | 365/189.5 |
| 5,214,609 | 5/1993 | Kato | 365/230.8 X |

Primary Examiner—Eugene R. LaRoche
Assistant Examiner—Son Mai
Attorney, Agent, or Firm—Edward D. Manzo; John J. King

[57] ABSTRACT

A method and circuit for configuring I/O devices, such as a DRAM or other memory device, uses master-slave buffer circuits in configurable I/O devices. When arranged in a master-slave arrangement, the slave data buffer is adapted to receive both input data and the output of an associated master circuit. In one configuration, each data buffer outputs data based upon the input data. In another configuration, each slave buffer outputs the output of an associated master buffer. The circuit of the present invention is preferably employed with a configurable I/O device incorporated in a lead-on-chip (LOC) package, although could be used in any configurable I/O device.

13 Claims, 7 Drawing Sheets

METHOD AND CIRCUIT FOR CONFIGURING I/O DEVICES

FIELD OF THE INVENTION

This invention relates to a method and circuit for configuring I/O devices and more particularly to a master-slave buffer/latch circuit for configurable I/O devices.

DESCRIPTION OF THE PRIOR ART

An I/O device generally is used to receive input data and to generate output data. I/O devices as used herein includes memory devices, such as DRAMs and SRAMs, and microprocessors or other controller chips. In a "configurable" I/O device, it is possible to select between different modes or configurations. A 16 MB DRAM may illustratively include forty-two input pins, sixteen of which may be dedicated to receive or output data. The data input/output pins are coupled to bond pads on the chip, and the bond pads may communicate with data buffers in the DRAM. The DRAM may also include eleven address pins to receive an address designating the location in the DRAM where the data is to be stored or read from. The remaining pins are used typically for control signals, power supply, and ground (or are not connected).

A configurable 16 MB DRAM may be configured as a "by-16" device or a "by-8" device. When configured as a by-16 device, a 16 MB DRAM receives sixteen data bits at the sixteen data input/output pins. These input data bits represent a single 16-bit word which is stored in the DRAM at a location determined by address bits received at the address pins. Therefore, conventional data buffers, which are generally located in the peripheral circuitry of the DRAM, can be employed because there are sixteen available inputs pins of the DRAM to receive the sixteen bits of data.

When such a DRAM is configured as by-8 device, only eight bits of data at a time are input to the DRAM. However, sixteen bond pads (for data) on the chip may still be required to allow full use of the DRAM. For example, eight bond pads on the chip may be used to provide data to one half of the DRAM and eight other bond pads on the chip may be used to provide data to the other half of the DRAM. If only eight bond pads were used, some of the storage capacity of the DRAM could be forsaken. Therefore, it is preferred that all sixteen internal bond pads coupled to input buffers of the DRAM be coupled to receive respective ones of the eight input data bits in order to use efficiently the available space in the DRAM.

When the DRAM is configured as a by-8 device, one way to ensure that each of the sixteen internal bond pads receives a respective one of the eight input data bits would be by physically connecting each data input-/output pin receiving data to multiple bond pads. In particular, bond wires can be used to connect each one of eight input pins to two corresponding bond pads within the circuit. However, such connections result in substantially higher input capacitance. Because each of the eight input pins would be coupled to two separate buffer circuits, the input capacitance will at least double.

An alternative solution would be to use additional buffer circuitry to drive multiple internal buses. The circuitry can be incorporated in the device via metal options depending upon the configuration. The buses can be routed to couple signals received at particular input pins to multiple bond pads. However, a large driver must be used to drive the additional load of multiple buses. Also, the loading between options would differ when additional buffer circuitry is employed.

Therefore, an object of the present invention is to provide configurable I/O devices wherein the external capacitance does not vary significantly with the configurable options.

Another object of the present invention is to provide a configurable I/O device requiring no physical change to the bus driver circuitry between options.

A further object of the present invention is to provide a master-slave buffer/latch for configurable I/O devices which is easily implemented with lead-on-chip (LOC) packaging.

SUMMARY OF THE INVENTION

The present invention is directed to a method and circuit for configuring an I/O device, such as a DRAM or other memory device. In general terms, the present invention is directed to the use of master-slave buffer circuits in configurable I/O devices. Data buffers receive an input signal and generate an output signal. When arranged in a master-slave arrangement, a slave data buffer is allowed to receive separately both input data and the output of an associated master circuit. In one configuration, each data buffer outputs data based upon the input data. In another configuration, each slave buffer outputs the output of an associated master buffer. The circuit of the present invention is preferably employed with a configurable I/O device incorporated in an LOC package, although the circuit could be used in any configurable I/O device.

BRIEF DESCRIPTION OF THE DRAWINGS

In describing the present invention, reference is made to the following drawings wherein.

DESCRIPTION OF THE PREFERRED EMBODIMENTS

Figure 1:
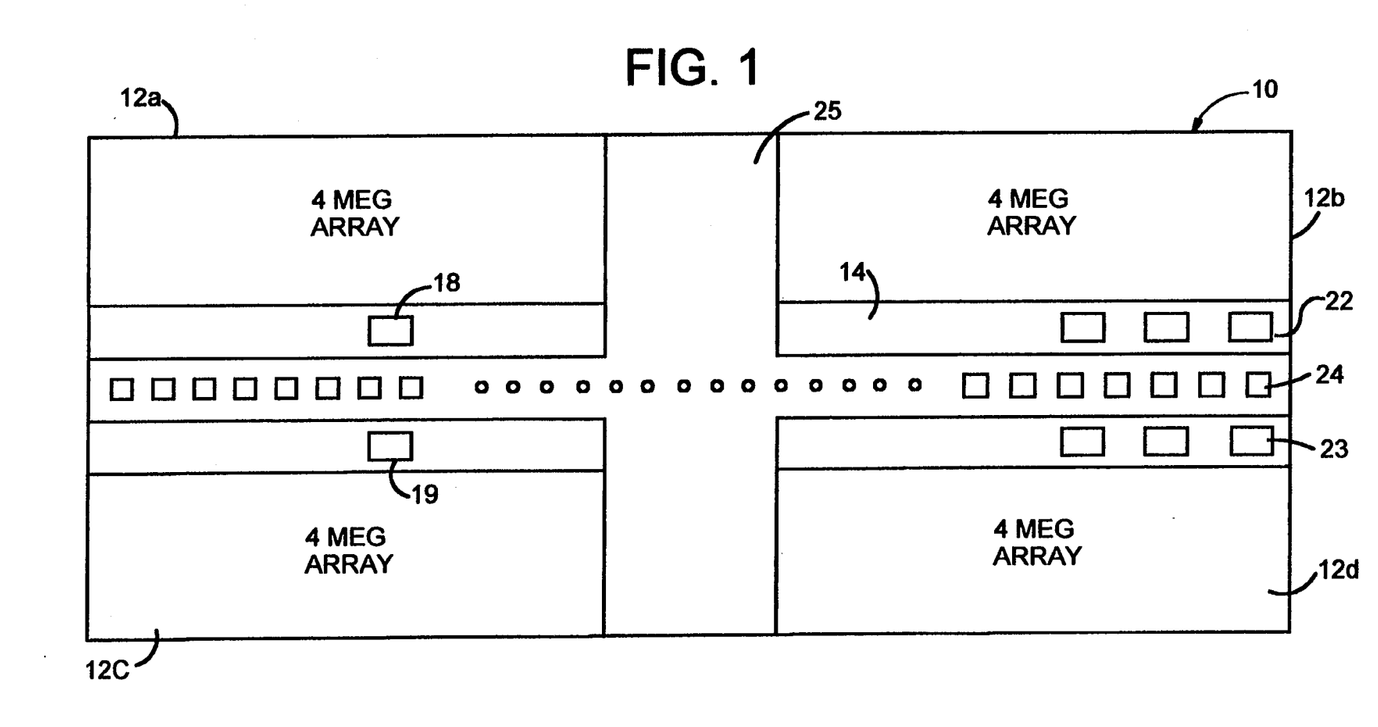
FIG. 1 is a simplified layout drawing of a DRAM incorporating the master-slave buffer/latch circuit of the present invention.

FIG. 1 shows part of the layout of a DRAM 10 having 16 megabyte (MB) storage capacity. The packaging is not shown, and the figure shows only some of the features. Although the method of configuring master-slave buffers and the circuits of the present invention can be employed with any configurable I/O device, the method and circuits are preferably incorporated in an LOC package, and they will be described in reference to a 16 MB DRAM designed for an LOC package.

Generally, DRAM 10 is divided into four quadrants, each quadrant including a 4 MB respective subarray 12a, b, c, or d. However, it is to be understood that other chip architectures dividing the chip into different subarrays could be employed.

Bordering each of the subarrays is a region 14 for peripheral circuitry. Among other circuits typically employed in a DRAM, the peripheral circuitry according to the illustrative embodiment of the invention may include write control circuits 18 and 19 (including data latch circuits 20, described infra) and master-slave buffer/latch circuits 22 and 23. The top arrays 12a, b are separated from the bottom arrays 12c, d by a series of bond pads 24 on the chip which extend along the major axis of the chip (shown horizontally). The chip shown in FIG. 1 may include approximately, 54 bond pads. Generally, the arrays on the left side of the chip are separated from the arrays on the right side by a region 25 which may advantageously include column logic.

Figure 2:
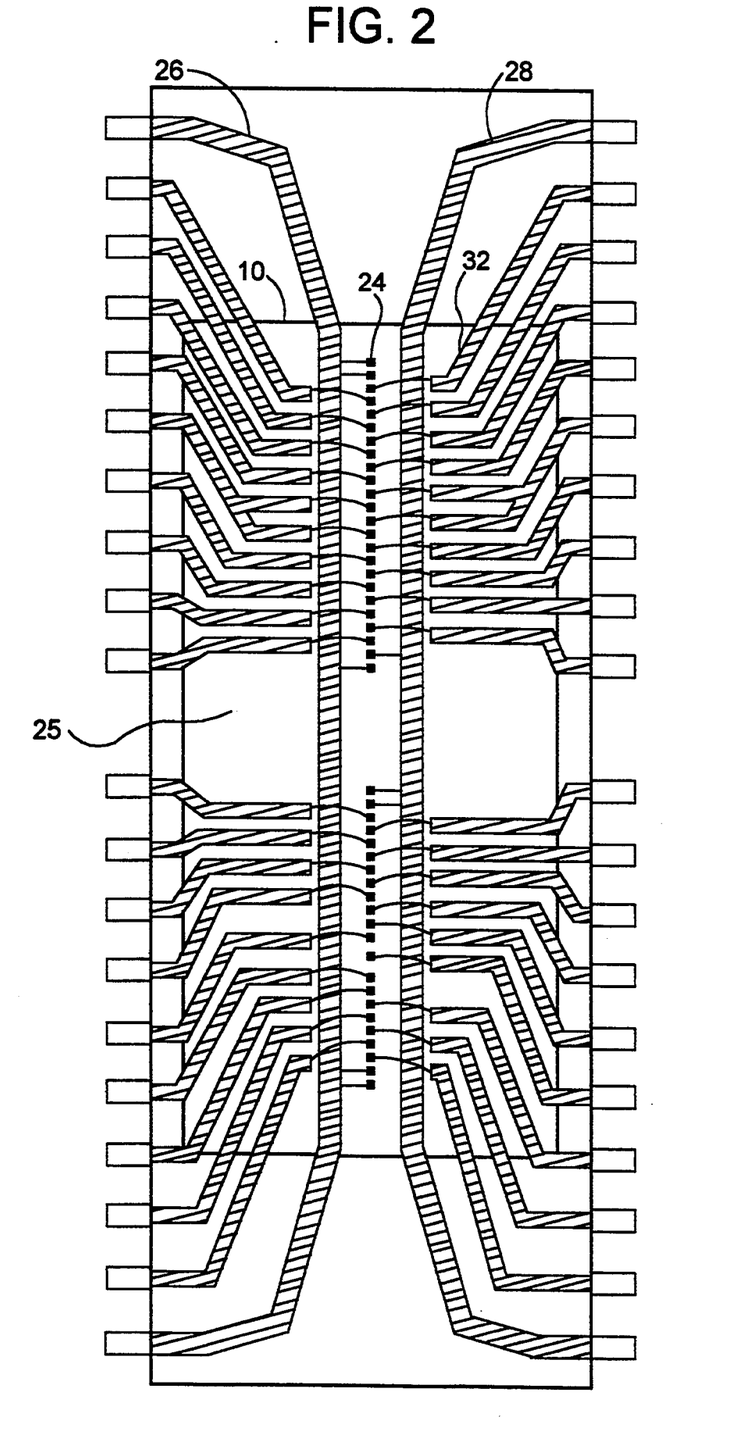
FIG. 2 is a plan view of the LOC package incorporating the DRAM of FIG. 1.

Turning now to FIG. 2, the lead frame package for the 16 MB DRAM is shown. A power bus 26 (VCC) runs between the peripheral circuitry associated with the upper 4 MB arrays and the bond pads 24. Also, a ground bus 28 (VSS) runs between the peripheral circuitry associated with the lower 4 MB arrays and the bond pads. Because the bond pads 24 are located along the center of the chip, and the power bus 26 and the ground bus 28 run adjacent to the bond pads, any bond pad can be bonded easily to either the power or ground bus, or an adjacent chip lead 32. The lead frame package shown in FIG. 2 includes forty-two chip leads, sixteen of which may be dedicated to inputting and outputting data. The benefits of employing the method and circuit of the present invention in an LOC package will become apparent in reference to the remaining figures.

The Block Diagram Circuit

Figure 3:
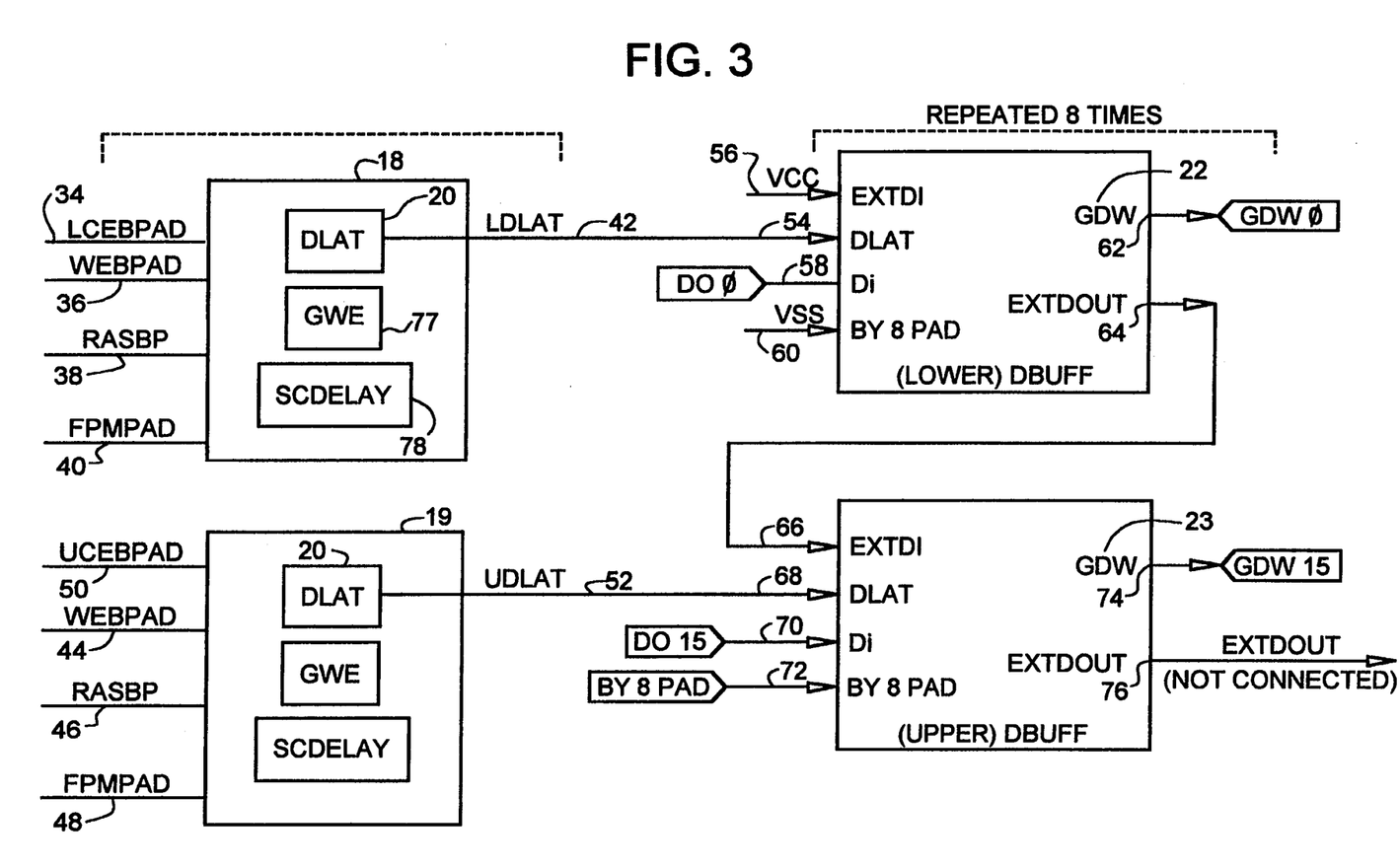
FIG. 3 is a block diagram of peripheral circuitry of the DRAM incorporating a data latch circuit and a master-slave buffer/latch circuit according to the preferred embodiment of the present invention.

FIG. 3 shows a block diagram of some peripheral circuitry 14 according to the preferred embodiment for configuring I/O devices. (It is to be understood that other peripheral circuitry is employed in a DRAM according to the present invention.) For simplicity, a 16 MB DRAM which is configurable as either a by-8 or a by-16 device (which includes eight pairs of master and slave buffers) will be discussed in detail. Also, the following detailed description will discuss the use of input data buffers. However, the method and circuits of the present invention could be applied to output data buffers. Similarly, the method and circuit of the present invention could be used for "multiplexing" address data when the DRAM includes separate address buffers for rows and columns. These applications of the present circuit will be evident in view of the description of the circuit as applied to input data buffers.

In the circuit shown in FIG. 3, the data buffers are arranged in pairs, each pair having a master buffer and a slave buffer. However, as will become apparent from the detailed description of the present invention, the circuit can easily be adapted to be used with other configurations. For example, the method and circuit employing master-slave data buffers could be employed in a DRAM which is configurable as either a "by-16" or "by-4" device. That is, the circuit could be configured to include groups of four buffers, each group having a master data buffer and three slave data buffers. Similarly, the circuit could be employed in a DRAM which is configurable as either a "by-4" or "by-1" device, or any other possible combination of configurations. Finally, the master-slave arrangement is not limited to buffer circuits, but can be employed whenever an input signal must drive two or more bond pads on a chip.

In the preferred embodiment, peripheral circuitry 14 includes a first (lower) write control circuit 18 for the top two arrays 12a, b (which may be dedicated to lower bits) and a second (upper) write control circuit 19 for the bottom two arrays 12c, d (which may be dedicated to upper bits). Preferably, the write control circuits for the top arrays and the bottom arrays are identical. The peripheral circuitry also includes a data buffer per each data input/output pin. A DRAM which can process sixteen bits (i.e. a "by-16" device) will typically include sixteen data buffers.

The data buffer circuits employed in FIG. 3 are configured in a master-slave arrangement and can be used to support both a by-16 device and a by-8 device. In this example, the data buffer circuits are configured in eight pairs, each pair consisting of one master data buffer 22 and one slave data buffer 23. Therefore, the pair of data buffers shown in FIG. 3 is repeated eight times. Preferably, the master data buffers 22 are associated with the top arrays, while the slave data buffers 23 are associated with the bottom arrays. An output of each master data buffer is coupled to an input of its associated slave data buffer. Write control circuit 18 is coupled to each of the eight master data buffers 22, and write control circuit 19 is coupled to each of the eight slave data buffers 23 in this example. However, a single write control circuit coupled to both master and slave data buffers could be used in a modification.

Operation of the Block Diagram Circuit

Having described the general layout of the write control and data buffer circuits in a 16 MB DRAM, the operation of the circuit will now be described. Write control circuit 18 receives a first (lower) column enable signal LCEB at an input 34, a write enable signal WEB at an input 36, a row access strobe signal RASBP at an input 38, and a fast page mode signal FPM at an input 40. Generally, signals LCEB, WEB, and RASBP are input to an input pin or pins of the DRAM, while FPM is selected via a bond option or metal option. First write control circuit 18 generates a first (lower) data latch signal LDLAT at an output 42 which is coupled to the (eight) master data buffer circuits 22. Second write control circuit 19 also receives the WEB, RASBP and FPM signals at inputs 44, 46, and 48 respectively. However, instead of receiving the LCEB signal, the second write control circuit 19 receives a second (upper) column enable signal UCEB at an input 50. Second write control circuit 19 generates a second data latch signal UDLAT at an output 52.

Although each pair of master and slave data buffers (e.g. 22, 23) will receive respective signals, reference will be made to the single pair of master and slave data buffers shown in FIG. 3, except where noted. The master data buffer 22 receives LDLAT at an input 54. Generally, LDLAT indicates when CEB, WEB, and RASBP are all low, designating an active write cycle. Master data buffer 22 also includes an input 56 to receive an external data input signal EXTDI and an input 58 to receive input data DI. Each master buffer preferably receives a separate DI signal. This DI signal is "lower bit" data. Finally, the master data buffer includes an input 60 for receiving a BY8PAD signal. For reasons which will become apparent in reference to the description of the logic diagram for the buffer circuit shown in FIG. 6, input 56 of master data buffer 22 (coupled to receive EXTDI) is tied high (VCC), while input 60 (coupled to receive BY8PAD) is tied low (VSS). In this configuration, the signal at output 62 is determined by the input data DI received at input 58 (while external data input signal EXTDI is ignored).

An external data output signal EXTDOUT, generated at an output 64 of master data buffer 22, is coupled to an input 66 of slave data buffer 23 as an external data input signal EXTDI. The slave data buffer also receives a data latch signal UDLAT at an input 68 from upper write control circuit 19 and input data DI at an input 70. Finally, the slave data buffer receives BY8PAD at an input 72.

Generally, slave data buffer 23 can generate one of two signals at its output. As will be discussed in more detail in reference to the detailed schematic of the buffer circuit of FIG. 6, the state of BY8PAD determines whether the signal generated at an output is (i) the input data DI at input 70, or (ii) the external data input EXTDI at input 66. In particular, when configured as a by-16 device, the BY8PAD signal applied to all sixteen buffers is low, indicating that sixteen separate input bits are to be coupled independently to sixteen separate buffer outputs. As a result, the eight lower data input bits coupled to eight master data buffers 22 are transferred to the respective GDW outputs of the master data buffers, while the eight upper data input bits coupled to the eight slave buffer circuits 23 are transferred to the respective GDW outputs of the slave buffer circuits.

However, if the configurable I/O device is configured as a by-8 device, the BY8PAD signal coupled to each of the eight slave buffers is tied high. As a result, each slave buffer 23 ignores input data at its input 70 and outputs the EXTDI signal received at its input 66 as GDW. The EXTDOUT outputs 76 of the slave buffer circuit are not needed and therefore are not connected.

Because of the location of the bond chip pads and the power and ground buses, there are benefits of employing the present circuit in an LOC package. In particular, the output 64 EXTDOUT of a master buffer 22 (associated with the top array) can easily be coupled to an input 66 EXTDI of a slave buffer 23 (associated with the bottom arrays) which may be on the other side of the circuit. Also, inputs BY8PAD can easily be bonded to either VCC or VSS, depending upon the configuration of the device. Alternatively, these connections can be made by a mask or metal option. Finally, because it is preferable to have symmetry in an I/O device, identical buffer circuits can be used for both master and slave buffers.

Global write enable (GWE) circuits 77 and static column delay (SCDELAY) circuits 78 are shown in block form in the write control circuits 18 and 19. These are disclosed fully in U.S. application Ser. No. 08/037,288, filed Mar. 26, 1993 which is incorporated herein by reference. Global write enable circuit 77 provides an extended internal write enable signal in a DRAM configured for static column mode operation. Static column delay circuit 78 provides a delay for the write enable signal and a delay for the address latch. These circuits improve the timing and noise margins when a DRAM is operating in the static column mode. These circuits are not essential subject matter, but can improve the performance of a configurable I/O device incorporating the method and circuit of the present invention.

The Data Latch Circuit

Figure 4:
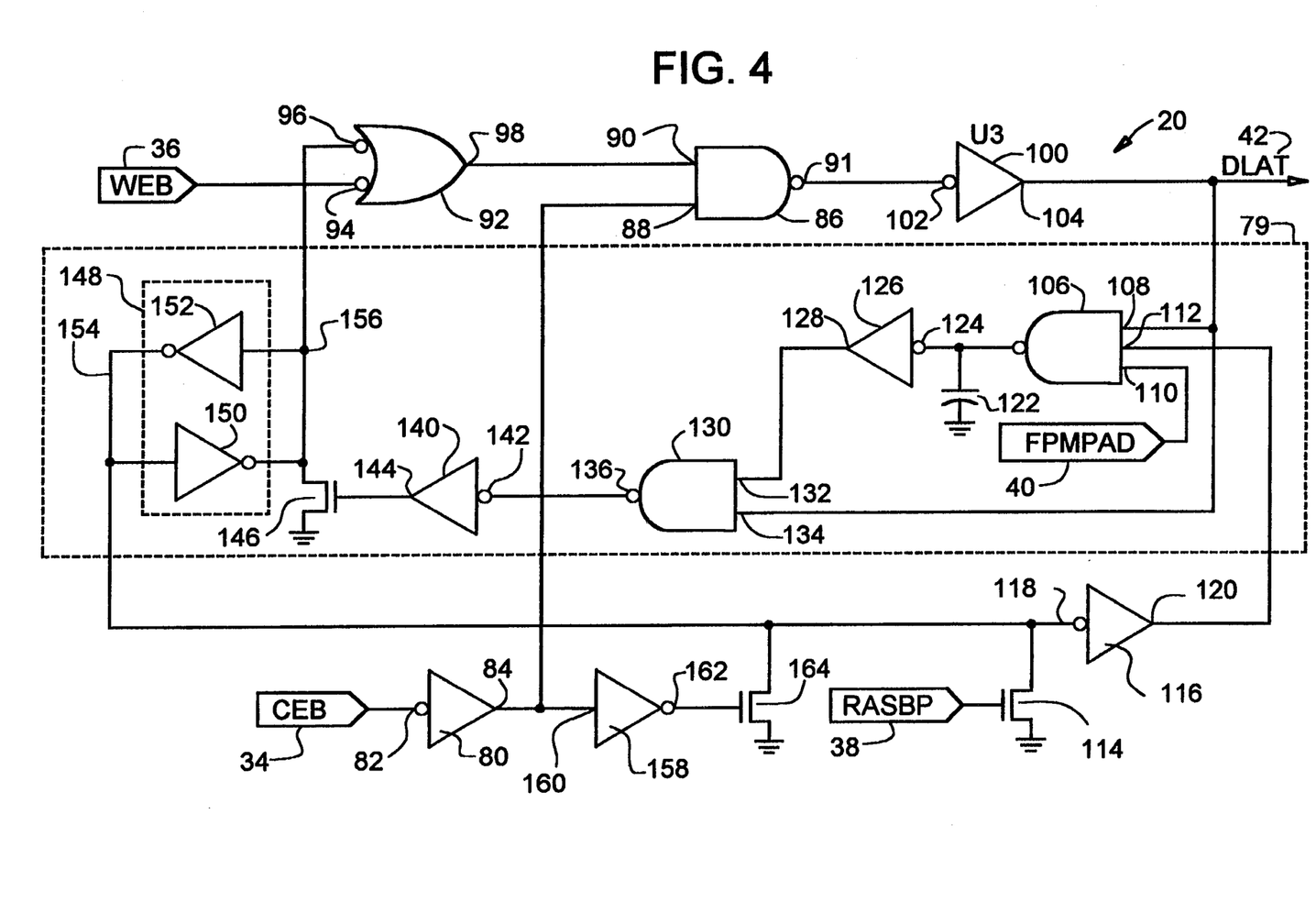
FIG. 4 is a block diagram of the data latch circuit shown in FIG. 3.

Turning now to FIG. 4, the preferred data latch circuit 20 for either of the write control circuits 18 and 19 is shown. Although other circuits which generate a data latch signal DLAT could be used within the scope of the present invention, circuit 20 of FIG. 4 includes a stabilizing circuit 79 to ensure that a stable data latch signal is generated. While a data latch signal is not required to be generated by the write control circuit 19 when the device is configured as a bye-8 device, data latch circuit 20 is the same for both write control circuits 18 and 19, and each of them will generate a respective data latch signal.

Data latch circuit 20 receives column enable signal CEB at input 34, write enable signal WEB at input 36, row access signal RASBP at input 38, and fast page mode signal FPMPAD at input 40. Data latch circuit 20 outputs DLAT at an output 42 which is coupled to buffer circuits. DLAT is used to indicate when an active write is occurring in order to latch input data. The generation of a DLAT signal at output 42 will be described first, followed by a detailed description of stabilizing circuit 79 of data latch circuit 20.

Generally, a high DLAT signal is generated at output 42 when inputs WEB and CEB are both low. CEB is coupled to an inverter 80 at an input 82. Inverter output 84 is input to a NAND gate 86 at a first input 88. The NAND gate includes a second input 90 and generates a signal at an output 91. The second input 90 is coupled to the output of a NAND gate 92. NAND gate 92 receives WEB at an input 94 and another signal at an input 96. This signal at input 96 is coupled to NAND gate 92 from stabilizing circuitry 79, discussed infra.

When CEB is low, the output of inverter 80 will be high. This high signal is coupled to input 88 of NAND gate 86. If WEB is low, the output of NAND gate 92 is also high, regardless of the signal at input 96. This high signal is coupled to input 90 of NAND gate 86. Because both inputs to NAND gate 86 are high, the signal at the output 91 is low. This low output of NAND gate 86 is inverted by inverter 100 to generate a high DLAT signal.

The stabilizing portion 79 of data latch circuit 20 is included to insure that the data latch circuit does not generate a high DLAT based upon a false or uncertain write enable signal WEB. The stabilizing circuit is enabled only when the DRAM is configured as a fast page mode device, which is well known in the art. The circuit of the present invention can be configured as a fast page mode device by a wire bond option, a metal option or by coupling a signal which would select fast page mode to the circuit. When operated in the static column mode, stabilizing circuit 79 is preferably disabled and does not affect the generation of a DLAT signal. Accordingly, the following description of stabilizing circuit 79 applies preferably only to a DRAM which is a fast page mode device.

Stabilizing circuit 79 includes a NAND gate 106 to receive the DLAT signal at an input 108. Also, gate 106 includes an input 110 to receive FPMPAD. This signal ensures that the stabilizing portion 79 is activated only when the DRAM is in the fast page mode. Finally, gate 106 includes an input 112 for receiving the latched state of a latch 148 by way of an inverter 116. When RASBP is high, transistor 114 is turned on, pulling node 154 of the latch and input 118 of inverter 116 low. The output 120 of inverter 116 is high. As a result, when RASBP previously has gone high and FPMPAD is high, a high DLAT will generate a low output of NAND gate 106, discharging a capacitor 122. As a node 124 coupled to capacitor 122 discharges, inverter 126 will generate a high signal at output 128.

This signal at output 128 is a "delayed" DLAT signal, allowing the state of DLAT at different times to be compared to determine whether a write enable signal WEB was false. In particular, the delayed DLAT signal is input to a NAND gate 130 at an input 132 and the DLAT signal is input directly at an input 134. If both inputs to the NAND gate 130 are high, the output 136 of the NAND gate is low. That is, if a valid WEB signal is received and DLAT remains high for a predetermined period, an output of the stabilizing circuit coupled to NAND gate 92 will hold DLAT in a high state until either CEB or RASBP changes state.

In particular, output 136 of NAND gate 130 is coupled to an inverter 140 at an input 142. Output 144 of inverter 140 is coupled to the control electrode of a transistor 146. When the output of NAND gate 130 is low, the output of inverter 140 is high, turning on transistor 146. This switches latch 148 and pulls low a node 156 coupled to input 96 of NAND gate 92. Therefore, the output of NAND gate 92 is high regardless the state of WEB at input 94. Accordingly, DLAT will remain high until CEB at the input of inverter 80 or RASBP at the control electrode of transistor 114 goes high.

The preferred embodiment of DLAT circuit 20 also includes components to reset the circuit when CEB or RASBP goes high and reset latch 148. In particular, if CEB goes high, the low signal at output 84 of inverter 80 is input to NAND gate 86 at input 88. Therefore, the output of NAND gate 86 will be high and DLAT will be low. Also, the output of inverter 80 is input to an inverter 158 at an input 160. Its output 162 is coupled to a control electrode of a transistor 164. The signal at output 162 has the same logic state as input CEB. When CEB is high, output 162 is high. This turns transistor 164 on, pulling the voltage at node 154 of the latch 148 low to reset the latch (and input 96 of NAND gate 92) for the next comparison of DLAT. Similarly, if RASBPP is high, transistor 114 is on, to pull the voltage at node 154 low to reset the latch. Therefore, the data latch circuit 20 of the preferred embodiment ensures that a stable DLAT signal is generated only when a valid write enable signal is received.

Figure 5:
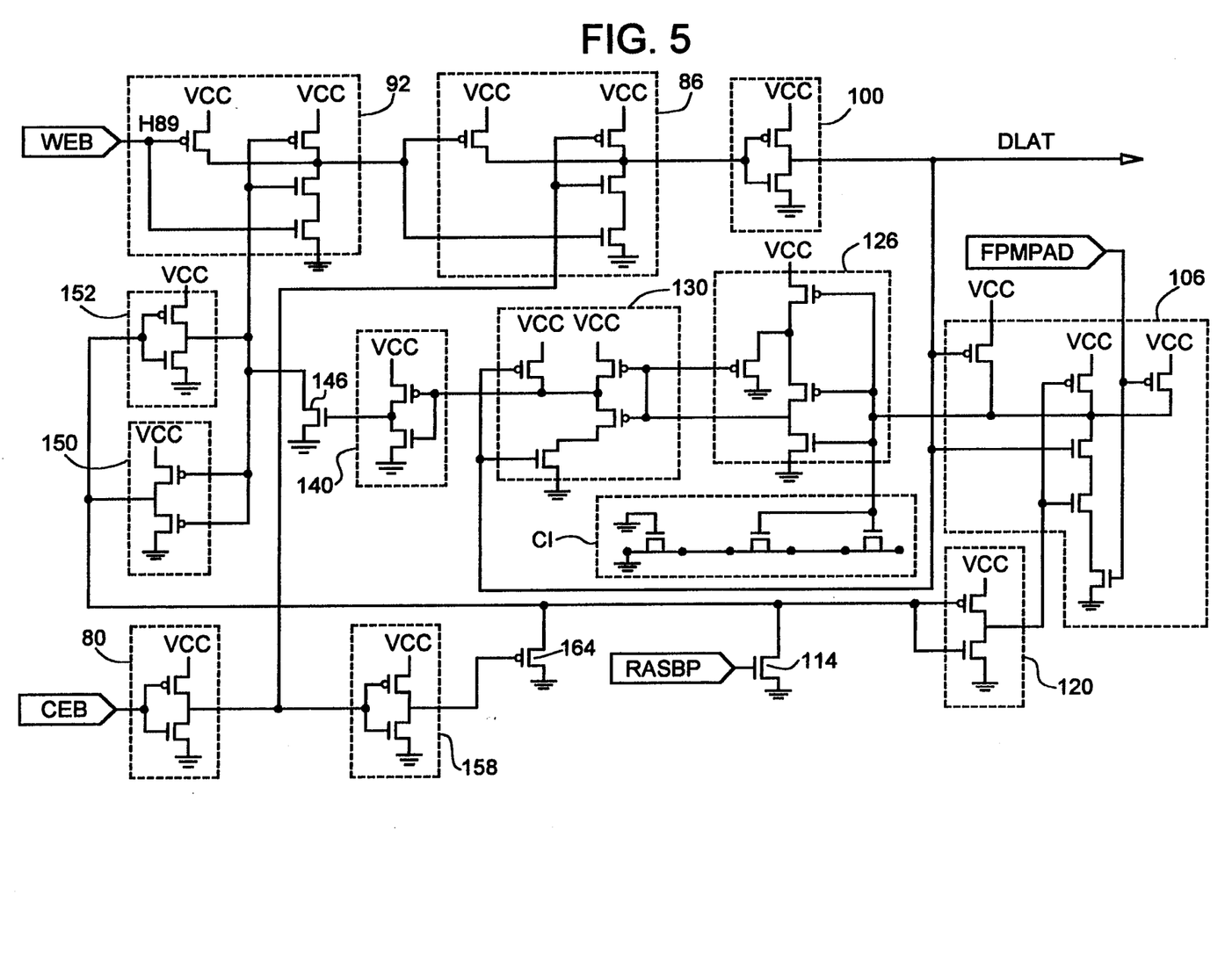
FIG. 5 is a detailed schematic diagram of the data latch circuit shown in FIG. 4.

Turning to FIG. 5, the preferred circuit implementing FIG. 4 is disclosed. Although other circuits incorporating the circuit of FIG. 4 could be used, the detailed circuit of FIG. 5 is one example of a circuit which could be used. The arrangements of transistors representing the gates shown in the logic diagram of FIG. 4 are well known in the art and are not described in detail here.

The Buffer Circuits

Figure 6:
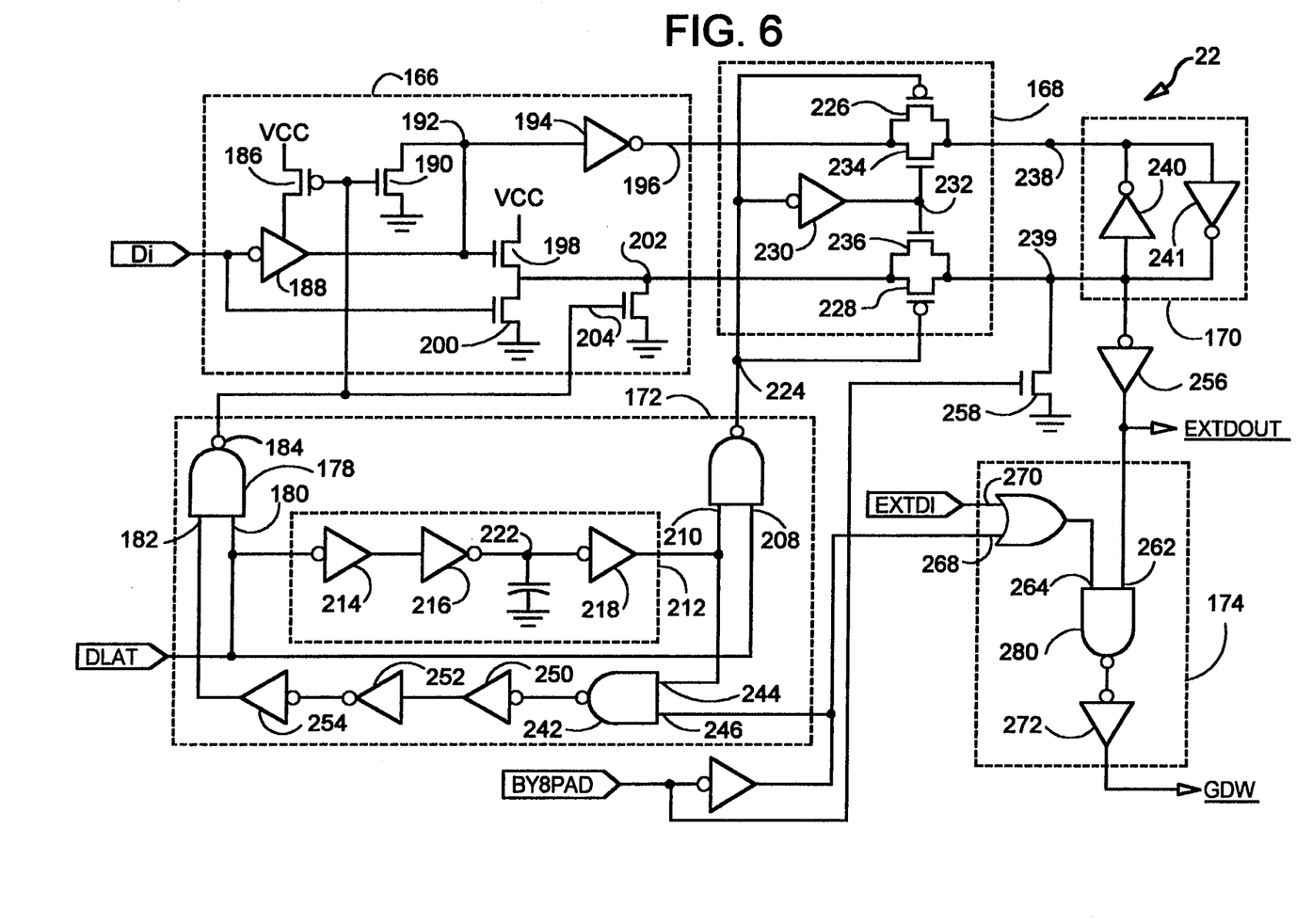
FIG. 6 is a block diagram of the master-slave buffer/latch circuit shown in FIG. 3.

Turning now to FIG. 6, a logic diagram for the buffer circuits is shown. The same circuit is used for master data buffer 22 and slave data buffer 23. As will be explained in detail, the only distinction between the circuits is the input and output signals. Further, while the circuits may be arranged to have pairs including a master and a slave, a slave buffer may function as a master buffer when the device is configured as a by-16 device. Therefore, the description of the master buffer will also apply to a slave buffer which is functioning as a master buffer.

Master data buffer 22 includes data buffer 166, gate 168, latch 170, timing circuit 172, and output circuit 174. The master data buffer receives signals DI, DLAT, EXTDI, and BY8PAD, and outputs signals EXTDOUT and GDW. Generally, the master data buffer will output DI as an output GDW. Similarly, in a by-16 device, the slave buffer will output DI as an output GDW. However, when configured as a by-8 device, the slave data buffer will ignore DI and will output EXTDI which was received as an input from its associated master data buffer. In particular, the BY8PAD signal decouples the front end of the circuit (that is, data buffer 166, gate 168, latch 170, and delay circuit 172). Also, By8PAD is input to output circuit 174, which allows the slave data buffer to receive EXTOLIT from the master circuit (as EXTDI) and output EXTDI as an output GDW.

Having described the general operation of the buffer circuit as both a master buffer and a slave buffer, a detailed description of the buffer as a master buffer will now be given. As will be described in more detail in reference to the operation of output circuit 174, a low BY8PAD signal input to a master buffer will ensure that output circuit 174 will transfer a "latched" DI signal as an output GDW and ignore EXTDI. Generally, timing circuit 172 turns on and off data buffer 166 and controls gate 168 to insure that the proper DI signal is latched by latch 170. To properly latch DI, timing circuit 172 insures that the following sequence takes place: (i) data buffer 166 is turned on; (ii) gate 168 is opened to allow latch 170 to latch DI; (iii) gate 168 is closed; and (iv) data buffer 166 is turned off.

In particular, when the I/O device is accessed, a high DLAT signal is input to a NAND gate 178 of the timing circuit 172 at an input 180. In the initial state, a second input 182 is high. Therefore, the output of NAND gate 178 at output 184 is low. The output 184 of the NAND gate is coupled to the gates of a P-channel transistor 186 and N-channel transistor 190 of data buffer 194. Therefore, the low output of the NAND gate turns on transistor 186 to enable inverter 188 and turns off transistor 190.

The output of inverter 188 is coupled to input 192 of an inverter 194 to generate a first output signal at a node 196. The output of inverter 188 (i.e. an inverted DI signal) is also coupled to the gate of a transistor 198, while DI is directly coupled to the gate of a transistor 200. Transistors 198 and 200 are coupled to generate a second output signal of buffer 166 at a node 202. That is, either transistor 198 or 200 will be on to generate a high or low voltage at node 202.

When the output of NAND gate 178 is high, transistors 190 and 204 are on. Therefore, the outputs at nodes 196 and 202 are pulled high and low respectively, regardless of the DI signal. However, when the output of NAND gate 178 is low (i.e. input buffer 166 is turned on), transistors 190 and 204 are off, and the outputs at nodes 196 and 202 are allowed to follow DI and an inverted DI signal, respectively.

After output signals of buffer 166 have been generated at nodes 196 and 202, the timing circuit 172 then opens gate 168 to switch latch 170. In particular, the DLAT signal is input to NAND gate 206 of timing circuit 172 at an input 208. A "delayed" DLAT is input to the second terminal 210 of NAND gate 206 by way of a delay circuit 212. The delay circuit 212 includes inverters 214, 216, 218, and a capacitor 220. Capacitor 220 is coupled between inverters 216 and 218 at a node 222. In the initial state, input 210 of the NAND gate is high. Therefore, when DLAT at input 208 goes high, the output of NAND gate 206 at a node 224 goes low. The output 224 is coupled to P-channel transistors 226 and 228. Because the output is low, these transistors are turned on. The output 224 is also coupled to an inverter 230. The output 232 of the inverter is coupled to the control electrode of N-channel transistors 234 and 236. When the output of NAND gate 206 is low, the inverter output 232 is high, and therefore turns on transistors 234 and 236 to open gate 168.

After a short delay, an "inverted" DLAT signal (inverted by delay circuit 21.2) is input to the second input 210 of NAND gate 206. The "inverted" DLAT signal is low, outputting a high signal at terminal 224 to turn off gate 168. This timing by timing circuit 172 ensures that the proper DI signal is latched at latch 170.

The inverted DLAT signal is also input to a NAND gate 242 at an input 244. Because the second input 246 to the NAND gate 242 is high (assuming a low BY8PAD signal for the master data buffer), NAND gate 242 will act as an inverter and will invert the signal at input 244. The signal at the output of NAND gate 242 is input to inverters 250, 252, and 254. Therefore, when DLAT is high (and the inverted DLAT is low), the output of NAND gate 178 is high. This signal turns off inverter 188 and turns on transistors 190 and 204 to turn off data buffer 166.

Having described a properly latched DI signal at latch 170, the operation of output circuit 174 be described. The output of the latch at node 239 is coupled to an inverter 256. The output of inverter 256 generates EXTDOUT (which is coupled to an associated slave buffer as EXTDI). The output of inverter 256 is input to a NAND gate 260 of output circuit 174 at a first input 262. A second input 264 of the NAND gate is coupled to the output of an OR gate 266. A first input 268 of OR gate 266 is coupled to the output of inverter 176. This output of inverter 176 provides an inverted BY8PAD signal. Because BY8PAD coupled to the master circuit is low, the output of inverter 176 is high. Accordingly, the output of the OR gate 266 (and the input to NAND gate 260) will be high regardless of the state of EXTDI. Therefore, with a high signal coupled to input 264, NAND gate 260 will act as an inverter and will invert the signal at input 262. The output of NAND gate 260 is coupled to inverter 272 which outputs GDW.

A transistor 258 is also coupled to the output of the latch at node 239. The gate of transistor 258 is coupled to receive BY8PAD. Because BY8AD of the master circuit is low, transistor 258 is off and does not affect node 239. The function of transistor 258 will be discussed infra in reference to the function of the buffer circuit of FIG. 6 as a slave.

To recapitulate, when the data buffer circuit of FIG. 6 is employed as a master circuit (or a slave circuit which is operated as a master circuit in a by-16 device), BY8PAD is low, allowing the data output circuit 174 to ignore EXTDI from an associated master circuit. In addition, timing circuit 172 controls buffer circuit 166 and gate 168 to ensure that DI is properly latched by a latch 170. The latched DI signal is coupled to output circuit 174 which generates an output GDW.

The operation of data buffer FIG. 6 as a slave buffer will now be described. When the data buffer functions as slave circuit (i.e. in a by-8 configured device), the data buffer ignores the DI signal and outputs EXTDI from a master buffer as GDW. Therefore, buffer 166, gate 168, latch 170 and timing circuit 172 can all be ignored. This can be accomplished by tying BY8PAD high. When BY8PAD is high, the output of inverter 176 is low. This output is coupled to input 246 of NAND gate 242. As a result, the output of NAND gate 242 will be high regardless of the input at 242. The high output of NAND gate 242 is passed through inverters 250, 252, and 254 and input to NAND gate 178 at input 182. The output of the NAND gate 178 will always be high, regardless of the DLAT, and therefore will turn off inverter 188 by way of transistor 186. As a result, DI is ignored.

A high BY8PAD signal is also coupled to the control electrode of transistor 258 to turn on the transistor and drive node 239 low. As a result, the input to inverter 256 is low regardless of the DI signal or the state of latch 170. A high output of inverter 256 is coupled to the first terminal 262 of the NAND gate 260. Because one input of NAND gate 260 is high, NAND 260 will act as the inverter of the other input (i.e. input 264). Input 264 is coupled to OR gate 266 to receive EXTDI from an associated master circuit. Because the output of inverter 176 coupled to the first terminal 268 of OR gate 266 is low, OR gate 266 will act as a buffer for the EXTDI signal. The output of OR gate 266 is transmitted by NAND gate 260 (acting as an inverter) and inverter 272. Accordingly, output GDW will follow EXTDI.

As is apparent from the description of the data buffer of FIG. 6, the circuit can easily be used as a master or slave buffer, depending on BY8PAD. The state of BY8PAD can be fixed by a wire bond or metal (mask) option, or, alternatively, can be a dynamic input from a register.

The use of buffer circuit of FIG. 6 in a configurable device is beneficial because some buffers may act as either a master or a slave buffer, depending upon the configuration of the device. That is, in the by-16 mode, the buffers designated as slave buffer will act as master buffers. In addition, for manufacturing purposes, it is beneficial to have a symmetrical device and incorporate identical buffers. Finally, the slave buffer of the present invention reduces power consumption by disabling input buffer circuit 166 which receives input data. Further, the upper write control circuit could be disable, and therefore not generate a DLAT signal. As a result, the gate 168 and latch 170 would not toggle with a changing DLAT.

Figure 7:
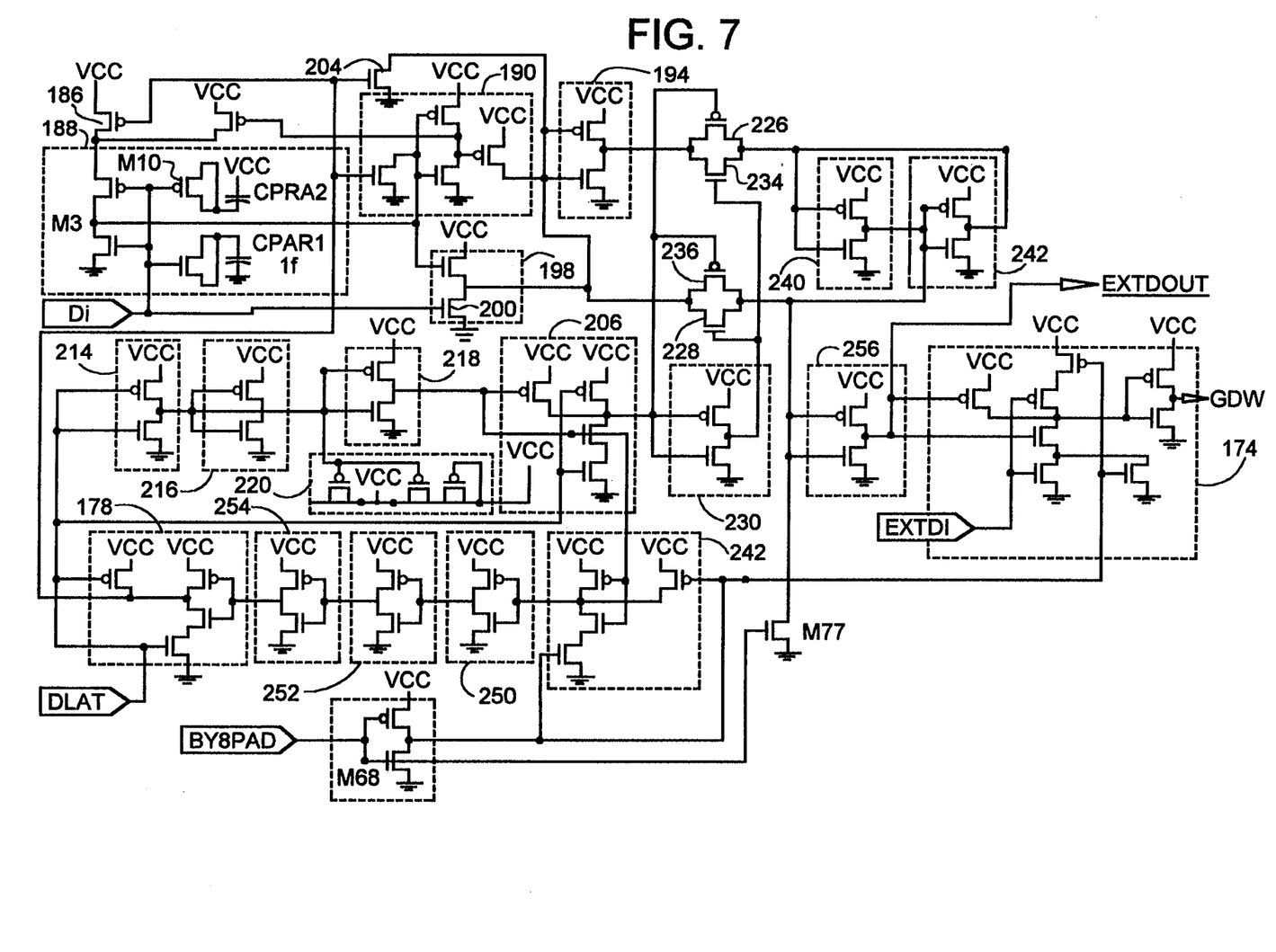
FIG. 7 is a detailed schematic diagram of the master-slave buffer/latch circuit shown in FIG. 6.

Turning now to FIG. 7, a detailed circuit implementing the logic diagram of FIG. 6 is shown. The arrangement of the transistors which comprise the various gates is well known in the art. The operation of the circuit of FIG. 7 is identical to that of FIG. 6 and will not be described again in detail. Although the circuit of FIG. 7 implements the logic circuit of FIG. 6, other circuits could also be employed. FIG. 7 is merely one example of a circuit incorporating the logic circuit of FIG. 6.

While this invention has been described with reference to an illustrative embodiment, it will be understood that this description is not intended to be construed in a limiting sense, but is intended to include any substitutes within the scope of the invention. Various modifications of the illustrative embodiment, as well as other embodiments, will become apparent to those skilled in the art upon reference to this description. For example, the method and circuit of the present invention could be employed with output buffers. Rather than receiving input data, the output buffers would receive output data from the memory. In particular, if the device (which is configurable as either a by-8 or a by-16 device) is configured as a by-8 device, eight output bits would be generated. However, it may be necessary to generate the eight output bits at sixteen data input/output pins. Instead of coupling the eight output bits to multiple data input/output pins or adding additional bus circuitry, a master-slave arrangement of buffer output circuits could be used.

In another modification, the master-slave arrangement could be used in any configurable device for purposes other than buffering data. For example, the master-slave arrangement could be used for multiplexing address data when a DRAM includes separate buffers for rows and columns. Rather than receiving input data, the buffers would receive address information. Accordingly, the invention is not intended to be limited by the specific examples set forth in the detailed description, but rather include only the limitations set forth in the following claims.

I claim:

1. An input/output circuit for a configurable DRAM including:
    a plurality of substantially similar buffer circuits including master buffer circuits and slave buffer circuits, each said master buffer circuit and each said slave buffer circuit respectively including a first input for receiving input data, a second input for receiving external data, a third input for receiving a control signal, and an output for providing an output signal;
    wherein said second input for receiving external data in each said master buffer circuit is not connected to receive data signals and said third input for receiving a control signal in each said master buffer circuit is maintained at a predetermined voltage so that the input data received at said first input is coupled to said respective output in each said master buffer circuit; and
    wherein said second input of each said slave buffer circuit is coupled to receive the output of a corresponding one of said master buffer circuits, said control signal of each said slave buffer circuit being selected to determine whether said output signal generated at said output of said slave buffer is said input data received at said first input of said slave buffer or said external data received at said second input of said slave buffer.

2. An input/output method of configuring a memory to avoid utilizing only part of the memory when a selected configuration is chosen, comprising the steps of:
    applying a first input data bit to an input of a master data buffer and providing output data therefrom;
    applying a second data bit to an input of a slave data buffer;
    applying output data from the master data buffer to another input of the slave data buffer;
    coupling a selected one of the output data from the master data buffer and the second data bit to an output of the slave data buffer;
    operating selectively in one mode of operation where the master data buffer and the slave data buffer receive respective data bits at said respective inputs and provide them to respective outputs, and in another mode of operation, the data input to the master data buffer is provided to both of said outputs; and
    applying data signals from said outputs to a group of input/output ("I/O") pads of the memory, each I/O pad receiving a data bit regardless of how the memory is configured.

3. The method of claim 2 further including applying a control signal to the slave data buffer and determining the mode of operation based on the control signal.

4. The method of claim 2 wherein for a memory configurable as a "by-N" device or as a "by-kN" device, k and N being integers, multiple groups are provided, each group having a respective master data buffer and one or more slave data buffers coupled thereto,
    the method including the step of applying data from the master data buffer to a respective input of each slave data buffer within the corresponding group;
    so that each of N I/O pads will receive a data bit from corresponding data buffers regardless of whether the memory is configured as a "by-N" device or as a "by-kN" device.

5. The method of claim 2 further comprising selectively powering down at least a latch portion of the slave buffer.

6. An input/output circuit for a configurable memory to avoid utilizing only part of the memory when a selected configuration is chosen, comprising:
    a master data buffer circuit having a first input for receiving input data and a first output for providing output data;
    a slave data buffer circuit coupled to said master data buffer and having a second input coupled to receive said output data from said master data buffer circuit, a third input for receiving input data independent of the master data buffer, and a second output for providing output data, and
    wherein said slave data buffer circuit includes a fourth input for receiving a control signal;
    wherein said slave data buffer is configured to provide, to said second output, data from a selected one of said second input and said third input, based on the control signal;
    wherein when in one state, the master data buffer and the slave data buffer are effective to receive respective data bits at said first and third input respectively and provide them to the first and second outputs respectively, and when in another state, the data input to the first input of the master data buffer circuit is provided to both said first output and said second output; and
    a control circuit coupled to provide data latch signals to said master data buffer circuit and said slave data buffer circuit, said control circuit being coupled to receive write control signals and including a data latch circuit having a feedback circuit to monitor a said data latch signal and to generate a stable said data latch signal.

7. The circuit of claim 6 wherein said control circuit includes first and second control circuits coupled to said master data buffer circuit and said slave data buffer circuit, respectively,
    wherein each said control circuit is adapted to receive write control signals and includes a respective data latch circuit, each said data latch circuit having a respective feedback circuit to monitor its respective data latch signal and to generate a stable data latch signal.

8. The input/output circuit of claim 6 wherein each said slave data buffer circuit includes an input buffer having said third input to receive said input data, a latch coupled to said input buffer to latch said input data from said input buffer, a control circuit coupled to said input buffer and to said latch to control the latching of said input data, and an output circuit having said second input, the output circuit also being coupled to receive latched input data from said latch.

9. An input/output circuit for a configurable DRAM memory to avoid utilizing only part of the memory when a selected configuration is chosen, comprising:
a plurality of master data buffer circuits and a plurality of substantially similar slave data buffer circuits, each master data buffer circuit being coupled to a corresponding slave data buffer circuit so that said data buffers are configured in pairs, each pair having a master buffer and a slave buffer;
each master data buffer circuit having a first input for receiving input data and a first output for providing output data;
each slave data buffer circuit being coupled to a corresponding master data buffer and having a second input couple to receive said output data from said corresponding master data buffer circuit, a third input for receiving input data, and a second output for providing output data, each said slave data buffer circuit including a fourth input for receiving a control signal;
each said slave data buffer being configured to provide, to said second output, data from a selected one of said second input and said third input, based on the control signal;
wherein when in one state, the master data buffer and its corresponding slave data buffer are effective to receive respective data bits at said first and third inputs respectively and provide them to the first and second outputs respectively, and when in another state, the data received at the first input of the master data buffer circuit is provided to both said first output and said second output;
wherein each said slave data buffer circuit includes an input buffer having said third input to receive said input data, a latch coupled to said input buffer to latch said input data from said input buffer, a control circuit coupled to said input buffer and to said latch to control the latching of said input data, and an output circuit having said second input, the output circuit also being coupled to receive latched input data from said latch.

10. The input/output circuit for a configurable memory of claim 9 wherein said control signal includes a first state and a second state;
wherein said output data receive at said second input is generated as output data at said second output when said control signal is in a first state; and
wherein said input data received at said third input is generated as output data at said second output when said control signal is in said second state.

11. An input/output method for configuring an integrated circuit random access memory including a plurality of circuits each having an input for receiving input data and an output for providing output data, the method comprising the steps of:
receiving a first data input signal at a master data buffer data input;
developing first and second data outputs from the master data buffer based on said first data input signal, and applying said first data output to the random access memory;
applying said second data output to one data input of a slave data buffer that has been grouped with the master data buffer;
receiving a second data input signal at another data input of said slave data buffer;
developing a third data output at said slave data buffer and applying said third data output to the random access memory, said developing step including receiving a control signal at a control input to said slave data buffer and depending on the state thereof, developing the third data output so that it corresponds to data received at a selected one of the one data input and the other data input of the slave data buffer;
so that the random access memory receives respective data inputs from the master data buffer and the slave data buffer, where the data states of the data outputted from the buffers to the memory are the independent or dependent of one another, based on the state of the control signal.

12. The method for configuring a memory of claim 11 wherein each said circuit consists of one master buffer circuit and one slave buffer circuit.

13. An input/output method for a configurable DRAM memory to avoid utilizing only part of the memory when a selected configuration is chosen, comprising the steps of:
buffering input data using a plurality of master and slave data buffer circuits, including:
buffering first input data using said master data buffer circuits and obtaining first output data therefrom;
applying data from said master data buffer circuits to corresponding said slave data buffer circuits;
buffering second input data using said slave data buffer circuits;
applying control signals to said slave data buffer circuits;
obtaining second output data from said slave data buffer circuits, based on the control signal, including selecting second output data from said second input data and said data applied from the master data buffer circuits to the slave data buffer circuits;
the method operating so that when the control signal is in one state, the master and corresponding slave data buffers receive respective data bits and provide as the first and second output data, respectively, and when the control signal is in another state, the data received at said master data buffer circuits are provided as both said first output data and said second output data;
wherein said step of buffering second input data includes input buffering said second input data, then latching the second input data and providing latched second input data to an output circuit, the method also including providing said data from the corresponding master data buffer circuit to said output circuit.

* * * * *